United States Patent

Won et al.

[11] Patent Number: 5,196,356
[45] Date of Patent: Mar. 23, 1993

[54] METHOD FOR MANUFACTURING BICMOS DEVICES

[75] Inventors: Tae Y. Won; Moon H. Kim, both of Seoul; Kwang D. Yoo, Incheon; Ji H. Yoo, Bucheon, all of Rep. of Korea

[73] Assignee: Samsung Electronics Co., Ltd., Suweon, Rep. of Korea

[21] Appl. No.: 874,612

[22] Filed: Apr. 27, 1992

[30] Foreign Application Priority Data

Nov. 14, 1991 [KR] Rep. of Korea ............... 91-20269

[51] Int. Cl.⁵ .......................................... H01L 21/265
[52] U.S. Cl. .................................... 437/31; 437/55; 437/59; 437/162; 148/DIG. 9
[58] Field of Search .............. 437/162, 59, 55, 31, 437/32, 33, 57; 148/DIG. 9; 357/34, 43

[56] References Cited

U.S. PATENT DOCUMENTS

| | | |
|---|---|---|
| 4,546,539 | 10/1985 | Beasom ............................ 437/31 |
| 4,694,562 | 9/1987 | Iwasaki et al. ................... 437/33 |
| 4,764,482 | 8/1988 | Hsu .................................. 437/59 |
| 4,868,135 | 9/1989 | Ogura et al. ..................... 437/31 |
| 4,956,305 | 9/1990 | Arndt ............................... 437/31 |
| 5,001,073 | 3/1991 | Huie .......................... 148/DIG. 9 |
| 5,011,784 | 4/1991 | Ratnakumar ..................... 437/31 |
| 5,045,912 | 9/1991 | Ohki ................................. 357/43 |
| 5,079,177 | 1/1992 | Lage et al. ................. 148/DIG. 9 |

*Primary Examiner*—Brian E. Hearn
*Assistant Examiner*—Tuan Nguyen
*Attorney, Agent, or Firm*—Ladas & Parry

[57] ABSTRACT

A method for BICMOS devices is disclosed, wherein an emitter and a base of a vertical PNP transistor are self-aligned, an extrinsic base is formed by adapting a base electrode polysilicon layer as a diffusion source, and the base electrode and an intrinsic base are coupled by diffusion of N type impurities adapting the N+ polysilicon as a diffusion source, so that the manufacturing process is simplified and the resistance of the extrinsic base is reduced.

8 Claims, 4 Drawing Sheets

METHOD FOR MANUFACTURING BICMOS DEVICES

FIELD OF THE INVENTION

The present invention relates to BICMOS devices and, more particularly, to a method for manufacturing polysilicon-gate CMOS transistors, a self-aligned NPN transistor and a vertical PNP transistor into a single chip.

In a conventional technology background of the invention for manufacturing BICMOS devices, the base of a vertical PNP transistor is formed by suing a base diffusion mask, and subsequently an emitter is formed in the base by using an emitter diffusion mask. Thus, a shown in FIG. 1, an N+type diffusion region is formed on a lightly doped N type base provided on a P type well so that this diffusion region serves as a base ohmic contact region between the N type base and a base electrode.

Thus, in the conventional technology, a highly doping diffusion process for the ohmic contact is additionally needed and an extrinsic base resistance occurs due to poor coupling between a highly doped base contact region and a lightly doped base region.

Also, the emitter and the base are not self-aligned each other, thereby degrading integration density and operation speed.

SUMMARY OF THE INVENTION

The present invention overcomes the above-described problems and provides a method for manufacturing BICMOS devices that simplifies the manufacturing process by omitting an N+type base diffusion process for the ohmic contact and has the emitter region and the base region self-aligned.

According to the present invention, there is provided a method for manufacturing BiCMOS devices, comprising the steps of forming a P type emitter and an N type base by self-alignment using an N+type polysilicon gate and an oxide spacer, and reducing resistance between the base region and an N+polysilicon base electrode by diffusion of N type impurities adapting the N+polysilicon as a diffusion source.

Other objects and features of the present invention will become apparent from a consideration of the following description which proceeds with reference to the accompanying drawings in which preferred embodiment is illustrated by way of example, and not by way of limitation.

DETAILED DESCRIPTION OF THE PREFERRED EMBODIMENT

Figure 1:
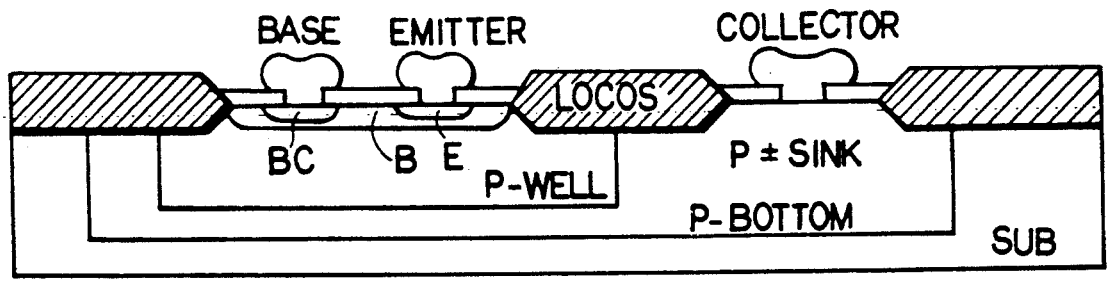
FIG. 1 is a cross-sectional view of a BICMOS device manufactured by conventional technology.
Figure 2A:
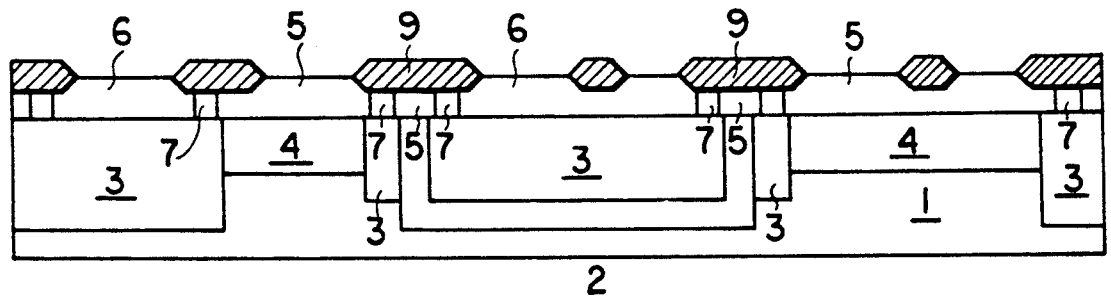
FIG. 2A to 2O are cross-sectional views illustrating manufacturing process of a BICMOS device according to the present invention.

Referring to FIG. 2A, and N+type buried layer 2 is formed in a P type substrate 1 to isolate P+type bottom layers 3 which serve as the collector regions of a vertical PNP transistor from the substrate 1. N+type bottom layers 4 are then formed by the known method as the P+type bottom layers 3. After formation of an intrinsic epitaxial layer on the entire surface of the structure, N and P type wells 5 and 6 are formed in the epitaxial layer by the well-known twin well process. Channel stop regions 7 are formed to present field inversion and next oxide layers 9 are alternatively formed by local oxidation of silicon process (LOCOS).

Figure 2B:
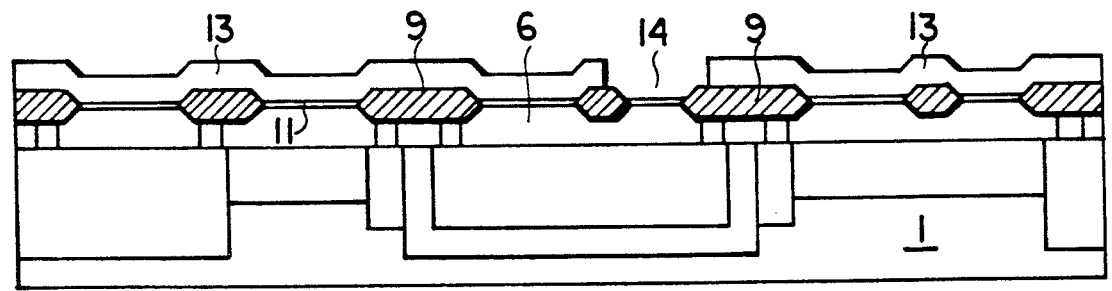

Referring to FIG. 2B, after growth of a sacrificial oxide layer 11 of 400–600 Å on the entire surface of the structure, a collector region of the vertical PNP transistor is defined by forming a window 14 through a photoresist layer 13 photolithographically. The collector region is next doped by ion implantation of P type impurities such as boron with a dose of $5 \times 10E14 \sim 2 \times 10E15$ ions/cm$^2$.

Figure 2C:
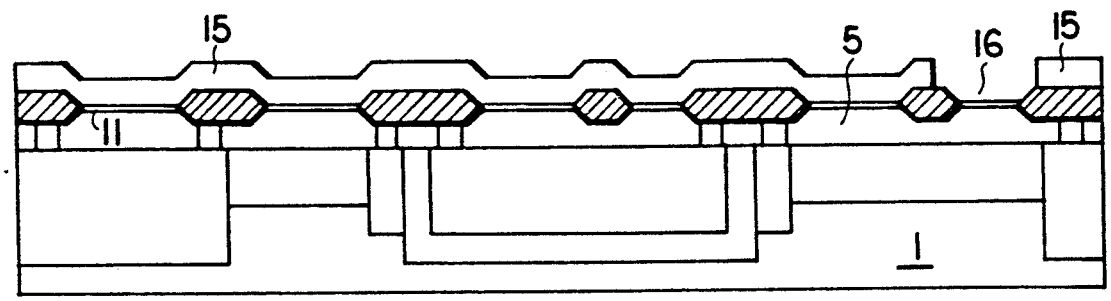

Referring to FIG. 2C, after removal of the photoresist layer 13, a collector region of an NPN transistor is defined by forming a window 16 through a photoresist layer 15 photolithographically. Next, this collector region is doped by ion implantation of N type impurities such as phosphorus with a does of $5 \times 10E14 \sim 2 \times 10E15$ ions/cm$^2$.

Figure 2D:
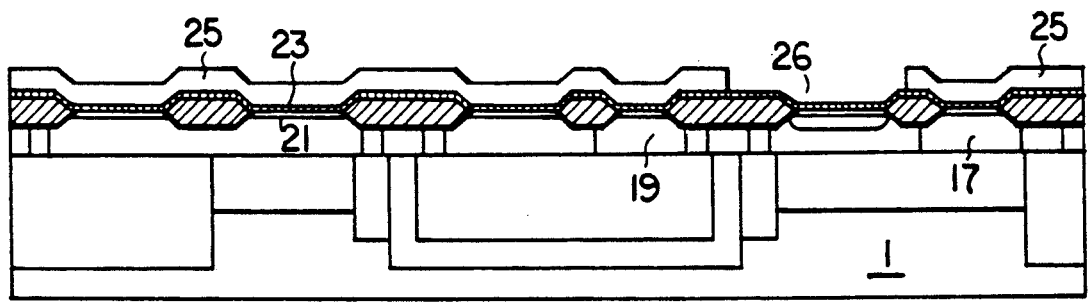

Referring to FIG. 2D, after removal of the photoresist layer 15, the substrate is annealed to form collector diffusion regions 17 and 19 of the NPN transistor and the vertical PNP transistor. After removal of the sacrificial oxide layer 11 by the general wet etching, a gate oxide layer 21 of 100–300 Å is grown by the well-known thermal oxidation.

A polysilicon layer 23 of 300–500 Å is subsequently deposited over the entire surface of the structure. The intrinsic base region of the NPN transistor is defined by forming a window 26 on a photoresist layer 25 photolithographically. This intrinsic base region is next doped by ion implantation of P type impurities such as boron with a does of $1 \times 10E14 \sim 5 \times 10E15$ ions/cm$^2$.

Figure 2E:
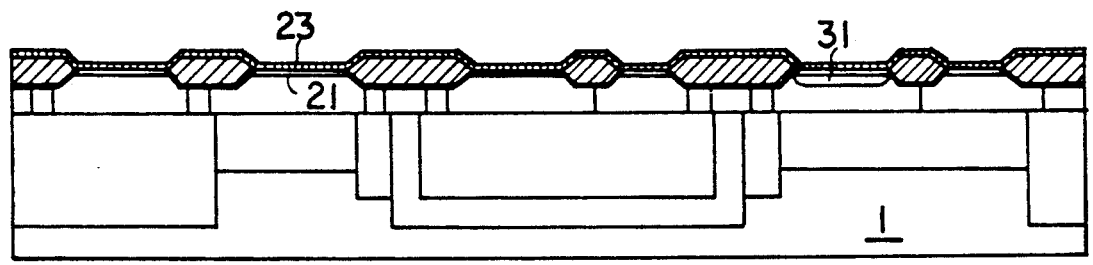

Referring to FIG. 2E, after removal of the photoresist layer 25, the substrate is annealed to form intrinsic base diffusion regions 31 of the NPN transistor.

Figure 2F:
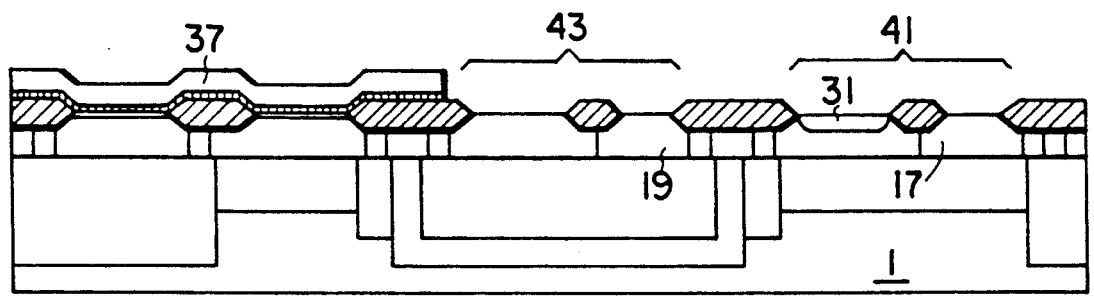
Figure 2G:
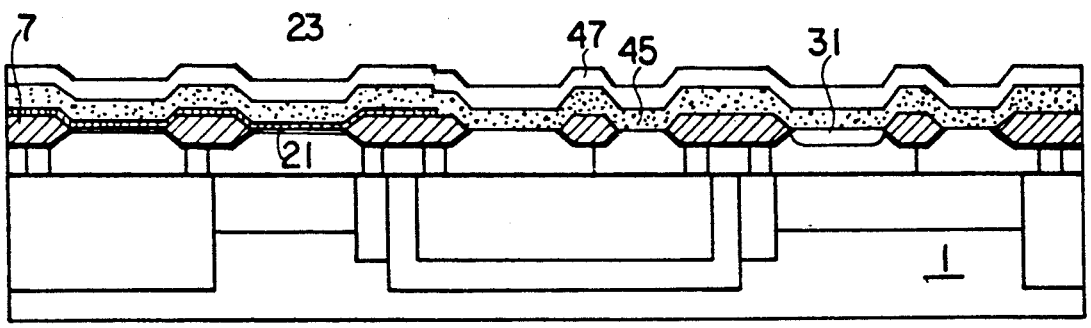

Referring to FIG. 2F, after formation of a window on photoresist layers 37 photolithographically, the polysilicon layer 23 and the gate oxide layer 21 are removed to expose both of the NPN transistor regions 41 and the vertical PNP transistor regions 43.

Referring to FIG. 26, after removal of the photoresist layer 37, a polysilicon layer 45 of 2000–4000 Å is deposited over the entire surface of the structure and is doped by ion implantation of N type impurities such as arsenic with a dose of $6 \times 10E15 \sim 1 \times 10E15$ ions/cm$^2$. A nitride layer 47 is deposited on this N+type polysilicon layer 45.

Figure 2H:
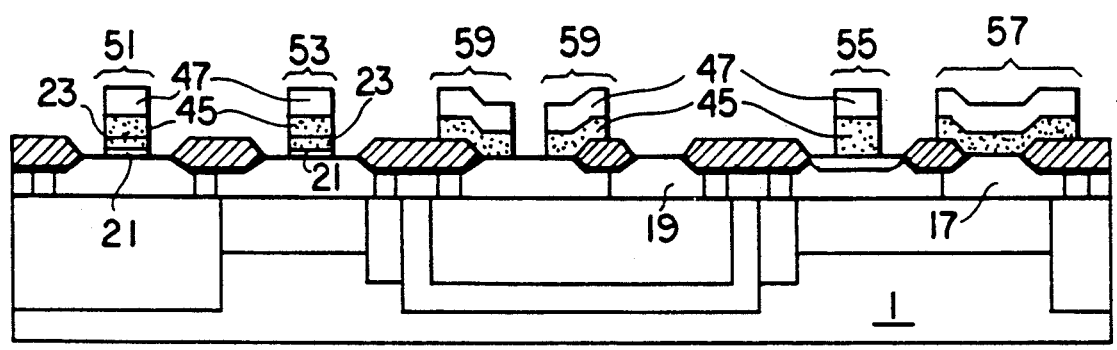

Referring to FIG. 2H, after sequentially removing the nitride layer 47, the polysilicon layer 45, the polysilicon layer 23 and the gate oxide layer 21 of the CMOS transistor region through the window of the photoresist layer by the general photolithography process, a gate 53 of the PMOS transistor, a gate 51 of the NMOS transistor, an emitter electrode 55 and a collector electrode 57 of the NPN transistor and a base electrode 59 of the vertical PNP transistor with a window for the emitter region are formed.

Figure 2I:
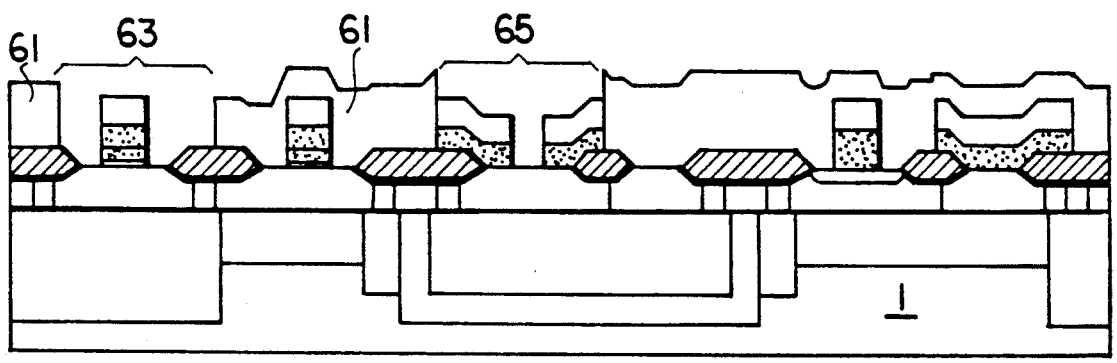

Referring to FIG. 2I, after defining of the NMOS transistor region 63 and the base region 65 of the vertical PNP transistor by forming windows on a photoresist layer 61 by the general photolithography process, the ion implantation of N type impurities such as phosphorus is performed to for ma source/drain regions of the NMOS transistor and the base region of the vertical PNP transistor.

Figure 2J:
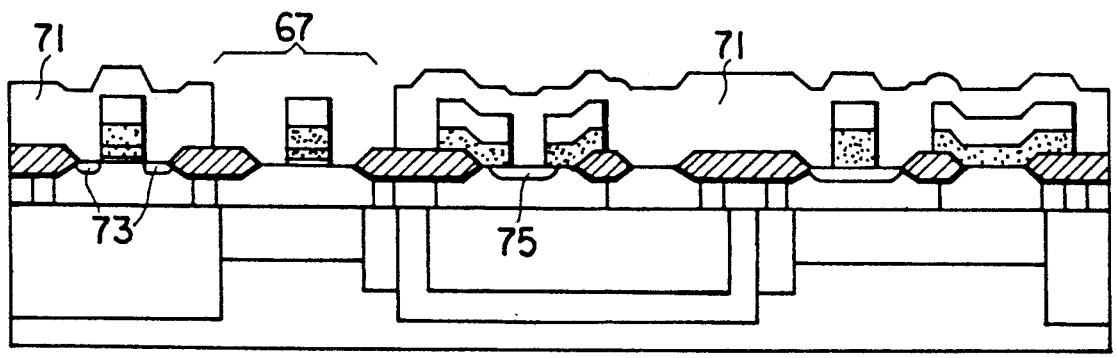

Referring to FIG. 2J, after removal of the photoresist layer 61, the implanted impurities are diffused by the general annealing process, thereby forming the source/drain regions 73 of the NMOS transistor and the intrinsic base region 75 of the vertical PNP transistor. A PMOS transistor region 67 is next defined by forming a window on a photoresist layer 71 by the general photolithography process, and the ion implantation of P type impurities such as boron is performed to form source/drain regions of the PMOS transistor.

Figure 2K:
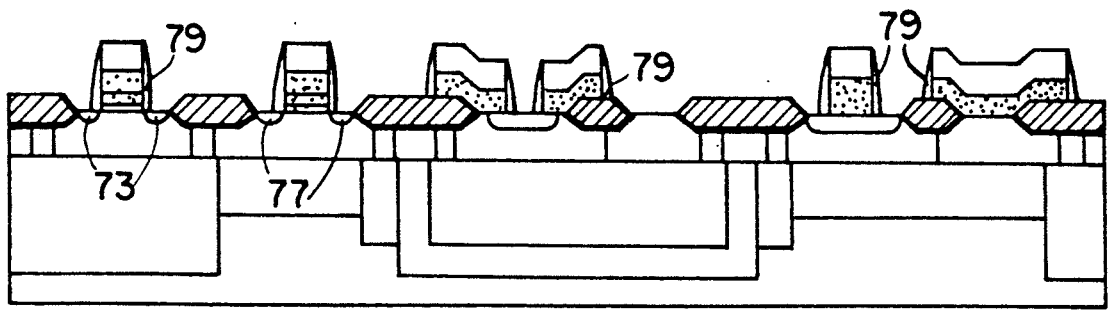

Referring to FIG. 2K, after removal of the photoresist layer 71, the source/drain region 77 of the PMOS transistor is formed by the general annealing process. An oxide layer of 3000-7000 Å is next formed at a low temperature and a sidewall oxide film 79 is formed by reactive ion etching process.

Figure 2L:
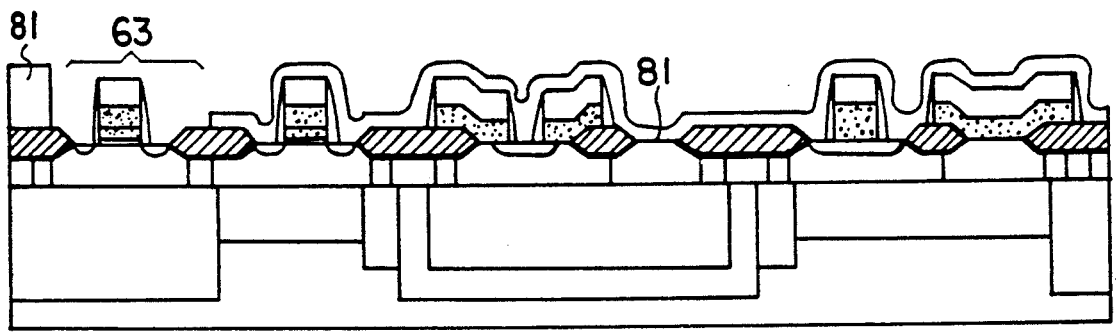

Referring to FIG. 2L, an NMOS transistor region 63 is defined by forming a window on a photoresist layer 81 photolithographically. Next, the N+type source/drain regions of the NMOS transistor is doped by ion implantation of N type impurities such as phosphorus with a dose of $1 \times 10E15 \sim 9 \times 10E15$ ions/cm$^2$.

Figure 2M:
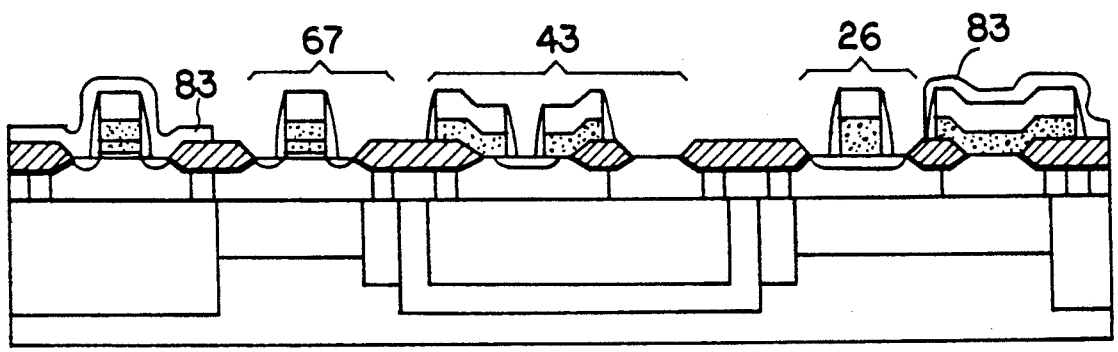

Referring to FIG. 2M, after removal of the photoresist layer 81, the PMOS transistor region 67, the vertical PNP transistor region 43 and the base region 26 of the NPN transistor are exposed by forming windows on a photoresist layer 83 again. The ion implantation of P type impurities such as boron is performed with a dose of $1 \times 10E15 \sim 5 \times 1015$ ions/cm$^2$ in order to dope the P+type source/drain of the PMOS transistor, the P+type emitter and collector regions of the vertical PNP transistor, and the extrinsic base region of the NPN transistor.

Figure 2N:
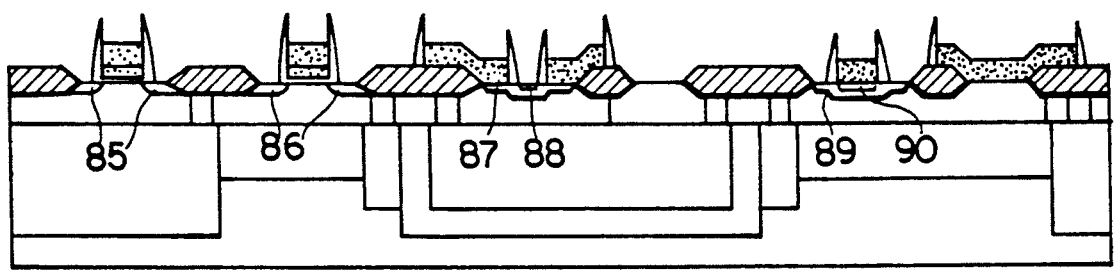

Referring to FIG. 2N, after removal of the photoresist layer 83, the nitride layer 47 is removed by the general etching process. The implanted P type impurities and the N type impurities in the N+type polysilicon layer are simultaneously diffused by the general annealing process, thereby forming the source/drain region 85 of the NMOS transistor, the source/drain region 86 of the PMOS transistor, the base and emitter regions 87 and 88 of the vertical PNP transistor, the base and extrinsic emitter regions 89 and 90 of the NPN transistor. The base region 87 is composed of the extrinsic base region formed by diffusion of the impurities in the polysilicon layer and the intrinsic base region 75. Also, both PMOS and NMOS transistors have the lightly doped drain (LDD) structure.

Figure 2O:
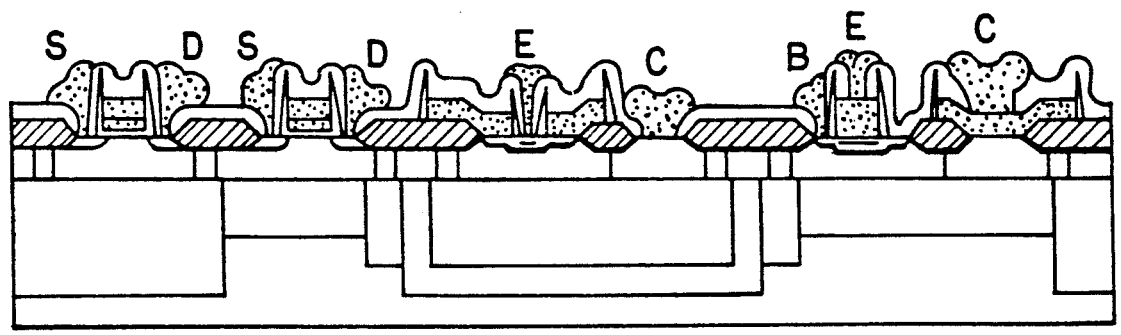

Referring to FIG. 2O, after deposition of an oxide layer, the source and drain electrodes S and D of both PMOS and NMOS transistors, the emitter, base and collector electrodes E, B and C of both vertical PNP and NPN transistors by the general contact and metallization processes.

As described hereinabove, according to the present invention the intrinsic base of the vertical PNP transistor is formed by using the N+type polysilicon base electrode of the vertical PNP transistor as the mask and the extrinsic base of the vertical PNP transistor is formed by using the N+polysilicon layer as the diffusion source so as to simplify the contact process of the intrinsic base and reduce the resistance of the extrinsic base by coupling with the intrinsic base. Also, according to the present invention the self-aligned emitter of the vertical PNP transistor can be formed by using the oxide spacer at the gate of the NMOS or the PMOS transistor for the LDD structure.

What is claimed is:

1. A method for manufacturing BiCMOS devices, comprising the steps of:

forming a buried layer of second conductive type in a silicon substrate of first conductive type and forming a highly doped bottom layer of said first conductive types and a highly doped bottom layer of said second conductive types;

growing an intrinsic epitaxial layer;

forming wells of said first conductive type and wells of said second conductive type in an epitaxial layer by a twin well process;

forming a channel stop region for preventing field inversion;

forming selectively a first insulating layer by a local oxidation of silicon;

defining a collector region of a vertical PNP transistor and a collector region of an NPN transistor photolithographically and doping said collector regions with impurities of said first conductive type and impurities of said second conductive type respectively;

growing said first insulating layer and depositing a first polysilicon layer;

defining an intrinsic base region of said NPN transistor photolithographically and doping said intrinsic base region with impurities of said first conductive type;

removing said first polysilicon layer and said first insulating layer on said NPN transistor region and said vertical PNP transistor region defined photolithographically;

depositing a second polysilicon layer and doping said second polysilicon layer with highly doped impurities of said second conductive type;

depositing a second insulating layer on said second polysilicon layer;

forming gates of CMOS transistors, emitter electrodes and collector electrodes of said NPN transistor, and base electrodes of said vertical PNP transistor by removing predetermined parts of said second insulating layer and said second polysilicon layer photolithographically;

defining an NMOS transistor region and an intrinsic base region of said vertical PNP transistor photolithographically and doping said regions with impurities of the second conductive type;

defining source/drain regions of said PMOS transistor photolithographically and doping said source/drain regions with impurities of said first conductive type;

depositing a third insulating layer and forming sidewall spacers by reactive ion etching of said third insulating layer;

defining source/drain regions of said NMOS transistor photolithographically and doping said source/drain regions with impurities of said second conductive type;

highly doping said source/drain regions of said PMOS transistor, said emitter/collector regions of said vertical PNP transistor, and said base of said NPN transistor;

removing said second insulating layer;

forming said extrinsic base of said vertical PNP transistor by using said second polysilicon layer as a diffusion source; and performing contact and metal interconnections.

2. The method according to claim 1, wherein said intrinsic base of said vertical PNP transistor and said source/drain regions of said NMOS transistor are simultaneously doped.

3. The method according to claim 2, wherein said intrinsic base is doped with impurities through a window formed on said second polysilicon layer.

4. The method according to claim 1, wherein said emitter of said vertical PNP transistor and said source/drain regions of said PMOS transistor are simultaneously doped.

5. The method according to claim 4, wherein said emitter is doped with impurities through a window formed on said second polysilicon layer.

6. The method according to claim 1, wherein said extrinsic base of said vertical PNP transistor is formed by using said polysilicon layer as a diffusion source.

7. The method according to claim 3 wherein said polysilicon layer is used as said base electrodes of aid vertical PNP transistor.

8. The method according to claim 1, wherein said extrinsic base of said vertical PNP transistor is formed around said intrinsic base.

* * * * *